(12) United States Patent
Oh et al.

(10) Patent No.: US 8,709,161 B2
(45) Date of Patent: Apr. 29, 2014

(54) THIN FILM DEPOSITION APPARATUS AND METHOD OF MANUFACTURING ORGANIC LIGHT-EMITTING DISPLAY DEVICE BY USING THE SAME

(75) Inventors: Ji-Sook Oh, Yongin (KR); Yong-Sup Choi, Yongin (KR); Jong-Heon Kim, Yongin (KR); Hee-Cheol Kang, Yongin (KR); Yun-Mi Lee, Yongin (KR); Chang-Mog Jo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 12/849,193

(22) Filed: Aug. 3, 2010

(65) Prior Publication Data

US 2011/0033964 A1 Feb. 10, 2011

(30) Foreign Application Priority Data

Aug. 5, 2009 (KR) .................. 10-2009-0072111

(51) Int. Cl.
*C23C 16/00* (2006.01)
(52) U.S. Cl.
USPC .......................................... 118/726; 118/727
(58) Field of Classification Search
USPC ................................................ 118/726, 727
See application file for complete search history.

(56) References Cited

U.S. PATENT DOCUMENTS

| | | | |
|---|---|---|---|
| 6,274,198 B1 | 8/2001 | Dautartas | |
| 6,371,451 B1 | 4/2002 | Choi | |
| 6,417,034 B2 | 7/2002 | Kitazume et al. | |
| 6,589,673 B1* | 7/2003 | Kido et al. | 428/690 |
| 6,749,906 B2 | 6/2004 | Van Slyke | |
| RE39,024 E | 3/2006 | Takahashi | |
| 7,078,070 B2 | 7/2006 | Peng | |
| 2001/0006827 A1 | 7/2001 | Yamazaki et al. | |
| 2002/0011785 A1 | 1/2002 | Tang et al. | |

(Continued)

FOREIGN PATENT DOCUMENTS

| | | |
|---|---|---|
| CN | 1556872 A | 12/2004 |
| CN | 1607868 A | 4/2005 |

(Continued)

OTHER PUBLICATIONS

English translation of JP 2004-137583, Sawada et al., May 2004.*

(Continued)

*Primary Examiner* — Keath Chen
(74) *Attorney, Agent, or Firm* — Christie, Parker & Hale, LLP

(57) ABSTRACT

A thin film deposition apparatus and a method of manufacturing an organic light-emitting display device using the thin film deposition apparatus. The thin film deposition apparatus includes a plurality of thin film deposition assemblies, each of which includes: a deposition source that discharges a deposition material; a deposition source nozzle unit that is disposed at a side of the deposition source and includes a plurality of deposition source nozzles; a patterning slit sheet that is disposed opposite to the deposition source nozzle unit and includes a plurality of patterning slits arranged in a first direction; and a barrier plate assembly that is disposed between the deposition source nozzle unit and the patterning slit sheet, in the first direction. The barrier plate assembly includes a plurality of barrier plates that partition a space between the deposition source nozzle unit and the patterning slit sheet into a plurality of sub-deposition spaces.

20 Claims, 11 Drawing Sheets

(56) References Cited

U.S. PATENT DOCUMENTS

| | | | |
|---|---|---|---|
| 2002/0017245 A1 | 2/2002 | Tsubaki et al. | |
| 2002/0076847 A1 | 6/2002 | Yamada et al. | |
| 2002/0168577 A1 | 11/2002 | Yoon | |
| 2002/0179013 A1 | 12/2002 | Kido et al. | |
| 2003/0101937 A1 | 6/2003 | Van Slyke et al. | |
| 2003/0168013 A1 | 9/2003 | Freeman et al. | |
| 2003/0221614 A1 | 12/2003 | Kang et al. | |
| 2003/0232563 A1 | 12/2003 | Kamiyama et al. | |
| 2004/0056244 A1* | 3/2004 | Marcus et al. | 257/40 |
| 2004/0115338 A1 | 6/2004 | Yoneda | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0016461 A1* | 1/2005 | Klug et al. | 118/726 |
| 2005/0031836 A1 | 2/2005 | Hirai | |
| 2005/0037136 A1 | 2/2005 | Yamamoto | |
| 2005/0072359 A1 | 4/2005 | Kim | |
| 2005/0166842 A1 | 8/2005 | Sakamoto | |
| 2005/0183670 A1* | 8/2005 | Grantham et al. | 118/726 |
| 2005/0263074 A1* | 12/2005 | Masuda et al. | 118/726 |
| 2006/0130766 A1 | 6/2006 | Kim et al. | |
| 2006/0144325 A1 | 7/2006 | Jung et al. | |
| 2006/0169211 A1 | 8/2006 | Kim et al. | |
| 2006/0174829 A1 | 8/2006 | An et al. | |
| 2006/0205101 A1 | 9/2006 | Lee et al. | |
| 2007/0077358 A1 | 4/2007 | Jeong et al. | |
| 2007/0178708 A1 | 8/2007 | Ukigaya | |
| 2008/0018236 A1 | 1/2008 | Arai et al. | |
| 2008/0115729 A1* | 5/2008 | Oda et al. | 118/726 |
| 2008/0118743 A1* | 5/2008 | Lee et al. | 428/332 |
| 2008/0131587 A1 | 6/2008 | Boroson et al. | |
| 2008/0216741 A1 | 9/2008 | Ling et al. | |
| 2009/0017192 A1 | 1/2009 | Matsuura | |
| 2009/0229524 A1 | 9/2009 | Kim et al. | |
| 2009/0232976 A1 | 9/2009 | Yoon et al. | |
| 2009/0279173 A1* | 11/2009 | Chui et al. | 359/577 |

FOREIGN PATENT DOCUMENTS

| | | |
|---|---|---|
| CN | 1704501 A | 12/2005 |
| CN | 1814854 A | 8/2006 |
| EP | 1 413 644 | 4/2004 |
| EP | 1 418 250 A2 | 5/2004 |
| EP | 1 518 940 | 3/2005 |
| JP | 4-272170 | 9/1992 |
| JP | 09-095776 | 4/1997 |
| JP | 10-050478 | 2/1998 |
| JP | 2000-68054 | 3/2000 |
| JP | 2001-52862 | 2/2001 |
| JP | 2001-93667 | 4/2001 |
| JP | 2002-175878 | 6/2002 |
| JP | 2002-348659 | 12/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2004-43898 | 2/2004 |
| JP | 2004-076150 | 3/2004 |
| JP | 2004-103269 | 4/2004 |
| JP | 2004-103341 | 4/2004 |
| JP | 2004-137583 | 5/2004 |
| JP | 2004-143521 | 5/2004 |
| JP | 2004-199919 | 7/2004 |
| JP | 2004-349101 | 12/2004 |
| JP | 2005-44592 | 2/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2007-47293 | 2/2007 |
| JP | 2007-146219 | 6/2007 |
| JP | 2008-121098 | 5/2008 |
| JP | 2009-19243 | 1/2009 |
| JP | 2009-87910 | 4/2009 |
| KR | 10-0257219 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 10-0405080 | 10/2003 |
| KR | 10-2003-0091947 | 12/2003 |
| KR | 10-2003-0093959 | 12/2003 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-0463212 | 12/2004 |
| KR | 10-0483487 B1 | 4/2005 |
| KR | 10-0520159 | 9/2005 |
| KR | 10-2006-0008602 | 1/2006 |
| KR | 10-2006-0018745 | 3/2006 |
| KR | 10-2006-0060994 | 6/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-0646160 | 11/2006 |
| KR | 10-0687007 | 2/2007 |
| KR | 10-2007-0025164 | 3/2007 |
| KR | 10-0696547 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 | 10/2007 |
| KR | 10-2008-0001184 | 1/2008 |
| KR | 10-0797787 | 1/2008 |
| KR | 10-0800125 | 1/2008 |
| KR | 10-0815265 | 3/2008 |
| KR | 10-0823508 | 4/2008 |
| KR | 10-0827760 | 4/2008 |
| KR | 10-0839380 | 6/2008 |
| KR | 10-2008-0060400 | 7/2008 |
| KR | 10-2008-0061132 | 7/2008 |
| KR | 10-2008-0062212 | 7/2008 |
| KR | 10-2009-0038733 | 4/2009 |
| KR | 10-2009-0079765 | 7/2009 |
| KR | 10-2009-0097453 | 9/2009 |
| KR | 10-2009-0098186 | 9/2009 |
| KR | 10-2010-0002381 | 1/2010 |

OTHER PUBLICATIONS

U.S. Appl. No. 13/031,756, filed Feb. 22, 2011, Yong Sup Choi et al., Samsung Mobile Display Co., Ltd.
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.

(56) References Cited

OTHER PUBLICATIONS

English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee at al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee at al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
English-language abstract of Korean Publication No. KR10-2002-0056238.
KIPO Office action dated Jul. 1, 2011 for Korean priority Patent application 10-2009-0072111, 4 pages.
KIPO Office action dated Jun. 1, 2011 for corresponding Korean Patent application 10-2009-0050528, 4 pages.
European Search Report dated May 13, 2011, for European Patent application 11250019.4, noting Category X reference EP 1 413 644, previously submitted in an IDS dated Feb. 17, 2011, 6 pages.
European Search Report dated May 20, 2011, for corresponding European Patent application 10251404.9, noting Category X reference 2005/0263074, listed in this IDS, 12 pages.
European Search Report dated Sep. 6, 2010, for European Patent application 10250962.7, 5 pages.
KIPO Registration Determination Certificate dated Oct. 27, 2011, for Korean Patent application 10-2010-0002381, 5 pages.
KIPO Registration Determination Certificate dated Sep. 23, 2011, for Korean Patent application 10-2009-0055473, corresponding to cross reference U.S. Appl. No. 12/784,804, 5 pages.
KIPO Registration Determination Certificate dated Sep. 28, 2011, for Korean Patent application 10-2009-0052359, corresponding to cross reference U.S. Appl. No. 12/784,804, 5 pages.
KIPO Registration Determination Certificate dated Sep. 28, 2011, for Korean Patent application 10-2009-0045200, corresponding to cross reference U.S. Appl. No. 12/784,804, 5 pages.
KIPO Registration Determination Certificate dated Sep. 28, 2011, for Korean Patent application 10-2009-0045201, corresponding to cross reference U.S. Appl. No. 12/784,804, 5 pages.
SIPO Office action dated Nov. 28, 2012, for Chinese Patent application 201110029291.3, (11 pages).
JPO Office action dated Mar. 19, 2013, for Japanese Patent application 2011-097909, (3 pages).
Japanese Office action dated Jan. 22, 2013, for Japanese Patent application 2010-116470 (3 pages).
Japanese Office action dated Jan. 8, 2013, for Japanese Patent application 2011-000180, (3 pages).
Patent Abstracts of Japan, and English machine translation of Japanese Publication 2004-349101 listed above (11 pages).
SIPO Office action dated May 23, 2013 for Chinese Patent application 201010189614.0, (12 pages).
U.S. Office action dated Jun. 11, 2013, for cross reference U.S. Appl. No. 12/979,656, (50 pages).

\* cited by examiner

THIN FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATION

This application claims the benefit of Korean Patent Application No. 10-2009-0072111, filed on Aug. 5, 2009, in the Korean Intellectual Property Office, the disclosure of which is incorporated herein in its entirety, by reference.

BACKGROUND

1. Field

The present teachings relate to a thin film deposition apparatus and a method of manufacturing an organic light-emitting display device using the same.

2. Description of the Related Art

Organic light-emitting display devices have drawn attention as next-generation display devices, due to having large viewing angles, excellent contrast characteristics, and fast response rates. In general, organic light-emitting display devices have a stacked structure, including an anode, a cathode, and an emission layer interposed between the anode and the cathode. When holes and electrons, injected respectively from the anode and the cathode, recombine in the emission layer, light is emitted to produce an image. However, it is difficult to achieve a high light-emission efficiency with such a structure, and thus, intermediate layers, including an electron injection layer, an electron transport layer, a hole transport layer, a hole injection layer, etc., are optionally interposed between the emission layer and the electrodes.

Also, it is difficult to form a fine pattern in organic thin films, such as the emission layer and the intermediate layers mentioned above, and red, green, and blue light emission efficiencies vary in the different layers. For these reasons, it is difficult to pattern a large-size target, such as a 5G or larger mother glass, with a conventional thin film deposition apparatus. Thus, it is difficult to manufacture a large organic light-emitting display device having a satisfactory driving voltage, current density, brightness, color purity, emission efficiency, and lifetime characteristics. Thus, there is a demand for improvements in this regard.

An organic light-emitting display device includes intermediate layers, including an emission layer disposed between a first electrode and a second electrode. The electrodes and the intermediate layers may be formed using various methods, one of which is a deposition method. When an organic light-emitting display device is manufactured using the deposition method, a fine metal mask (FMM), having the same pattern as a thin film to be formed, is disposed in close contact with a substrate. A thin film material is deposited over the FMM, in order to form a thin film having the desired pattern.

SUMMARY

The present teachings provides a thin film deposition apparatus that may be easily manufactured, that can simply manufacture large substrates on a mass scale, that has improved manufacturing yield and deposition efficiency, and that allows deposited materials to be reused. The present teachings also provide a method of manufacturing an organic light-emitting display device using the thin film deposition apparatus.

According to an aspect of the present teachings, there is provided a thin film deposition apparatus to form a thin film on a substrate, the apparatus including a plurality of thin film deposition assemblies, each of which includes: a deposition source that discharges a deposition material; a deposition source nozzle unit that is disposed on the deposition source and includes a plurality of deposition source nozzles arranged in a first direction; a patterning slit sheet that is disposed facing the deposition source nozzle unit and includes a plurality of patterning slits arranged in the first direction; and a barrier plate assembly that is disposed between the deposition source nozzle unit and the patterning slit sheet, and includes a plurality of barrier plates that partition a space between the deposition source nozzle unit and the patterning slit sheet into a plurality of sub-deposition spaces. The thin film deposition apparatus is separated from the substrate by a predetermined distance, and the thin film deposition apparatus and the substrate are movable relative to each other.

According to aspects of the present teachings, the deposition sources may respectively contain different deposition materials.

According to aspects of the present teachings, the deposition materials may be simultaneously deposited on the substrate.

According to aspects of the present teachings, the number of thin film deposition assemblies may be at least three, and deposition materials respectively contained in the deposition sources may form red, green, and blue emission layers.

According to aspects of the present teachings, the deposition materials may be continuously deposited on the substrate, while one of the substrate and the thin film deposition apparatus is moved relative to the other.

According to aspects of the present teachings, at least one of the thin film deposition apparatus and the substrate may be movable relative to the other, along a plane parallel to a surface of the substrate.

According to aspects of the present teachings, the patterning slit sheets may be smaller than the substrate.

According to aspects of the present teachings, the barrier plate assemblies may guide the discharged deposition materials to the patterning slit sheets.

According to aspects of the present teachings, the deposition temperatures of the deposition sources may be separately controllable.

According to aspects of the present teachings, the plurality of patterning slits of each of the thin film deposition assemblies may be offset by a predetermined distance, with respect to the patterning slits of the other thin film deposition assemblies.

According to aspects of the present teachings, the patterning slit sheets may be integrally formed into a single patterning slit sheet.

According to aspects of the present teachings, the single patterning slit sheet may include rows of the patterning slits, the patterning slits in each of the rows being offset by a predetermined distance with respect to the patterning slits in the other rows.

According to aspects of the present teachings, the patterning slits of each of the thin film deposition assemblies may have different lengths.

According to aspects of the present teachings, the amounts of the deposition materials deposited on the substrate may be controlled according to the lengths of the patterning slits.

According to aspects of the present teachings, each of the barrier walls may extend in a second direction that is substantially perpendicular to the first direction, in order to partition the space between the deposition source nozzle unit and the patterning slit sheet.

According to aspects of the present teachings, the barrier plates may be spaced apart at equal intervals.

According to aspects of the present teachings, each of the barrier plate assemblies may include a first barrier plate assembly including a plurality of first barrier plates, and a second barrier plate assembly including a plurality of second barrier plates.

According to aspects of the present teachings, each of the first barrier plates and each of the second barrier plates may extend in a second direction that is substantially perpendicular to the first direction, in order to partition the space between the deposition source nozzle unit and the patterning slit sheet.

According to aspects of the present teachings, the first barrier plates and the second barrier plate may be arranged in pairs.

According to aspects of the present teachings, each pair of the first and second barrier plates may be arranged on substantially the same plane.

According to another aspect of the present teachings, there is provided a method of manufacturing an organic light-emitting display device using a thin film deposition apparatus to form a thin film on a substrate, the method including: arranging the substrate a predetermined distance from the thin film deposition apparatus; and depositing a deposition material discharged from the thin film deposition apparatus onto the substrate, while one of the thin film deposition apparatus and the substrate is moved relative to the other. The thin film deposition apparatus includes a thin film deposition assembly including: a deposition source that discharges a deposition material; a deposition source nozzle unit that is disposed on the deposition source and includes a plurality of deposition source nozzles arranged in a first direction; a patterning slit sheet that is disposed facing the deposition source nozzle unit and includes a plurality of patterning slits arranged in the first direction; and a barrier plate assembly that is disposed between the deposition source nozzle unit and the patterning slit sheet, in the first direction, and includes a plurality of barrier plates that partition a space between the deposition source nozzle unit and the patterning slit sheet into a plurality of sub-deposition spaces.

According to aspects of the present teachings, depositing of the deposition material on the substrate comprises continuously depositing the discharged deposition material on the substrate, while one of the substrate and the thin film deposition apparatus is moved relative to the other.

According to aspects of the present teachings, the thin film deposition apparatus may include a plurality of thin film deposition assemblies that respectively discharge different deposition materials.

According to aspects of the present teachings, the depositing of the deposition material on the substrate comprises simultaneously depositing the different deposition materials on the substrate.

According to aspects of the present teachings, depositing of the deposition material on the substrate comprises forming red, green, and blue emission layers on the substrate.

According to aspects of the present teachings, the depositing of the deposition material on the substrate may further include heating the deposition materials to different temperatures.

According to aspects of the present teachings, the depositing of the deposition material on the substrate may further include discharging different amounts of the deposition materials from the thin film deposition assemblies.

Additional aspects and/or advantages of the present teachings will be set forth in part in the description which follows and, in part, will be obvious from the description, or may be learned by practice of the present teachings.

BRIEF DESCRIPTION OF THE DRAWINGS

These and/or other aspects and advantages of the present teachings will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
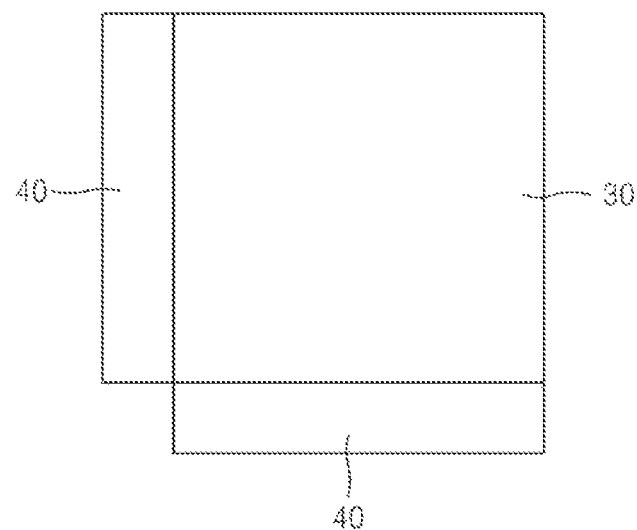
FIG. 1 is a plan view of an organic light-emitting display device manufactured by using a thin film deposition apparatus, according to an exemplary embodiment of the present teachings.

Reference will now be made in detail to the exemplary embodiments of the present teachings, examples of which are illustrated in the accompanying drawings, wherein like reference numerals refer to the like elements throughout. The exemplary embodiments are described below, in order to explain the aspects of the present teachings, by referring to the figures.

FIG. 1 is a plan view of an organic light-emitting display device manufactured using a thin film deposition apparatus, according to an exemplary embodiment of the present teachings. Referring to FIG. 1, the organic light-emitting display device includes a pixel region 30 and circuit regions 40 disposed at edges of the pixel region 30. The pixel region 30 includes a plurality of pixels, and each of the pixels includes an emission unit that emits light to display an image.

The emission unit may include a plurality of sub-pixels, each of which includes an organic light-emitting diode (OLED). In a full-color organic light-emitting display device, red (R), green (G) and blue (B) sub-pixels are arranged in various patterns, for example, in a line, mosaic, or lattice pattern, to constitute a pixel. The organic light-emitting display device may include a monochromatic flat display device, according to some aspects.

The circuit regions 40 control, for example, an image signal that is input to the pixel region 30. At least one thin film transistor (TFT) may be installed in each of the pixel region 30 and the circuit region 40.

The at least one TFT installed in the pixel region 30 may include a pixel TFT, such as a switching TFT that transmits a data signal to an OLED, according to a gate line signal, to control the operation of the OLED, and a driving TFT that drives the OLED by supplying current according to the data signal. The at least one TFT installed in the circuit region 40 may include a circuit TFT to implement a predetermined circuit. The number and arrangement of TFTs may vary, according to the features of the display device and the driving method thereof.

Figure 2:
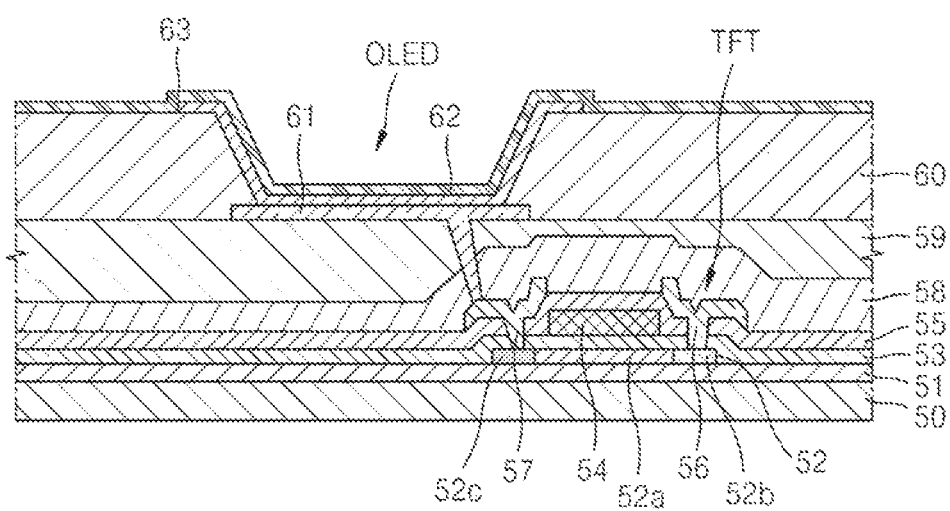
FIG. 2 is a sectional view of a sub-pixel of the organic light-emitting display device illustrated in FIG. 1.

FIG. 2 is a sectional view of a sub-pixel of the organic light-emitting display device illustrated in FIG. 1, according to an exemplary embodiment of the present teachings. Referring to FIG. 2, a buffer layer 51 is formed on a substrate 50. The substrate 50 may be formed of glass or plastic. A TFT and an OLED are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed to contact source/drain regions 52a and 52c, respectively, of the active layer 52, through contact holes. A passivation layer 58, formed of $SiO_2$, $SiN_x$, or the like, is formed on the source/drain electrodes 56 and 57. A planarization layer 59, which is formed of an organic material, such as acryl, polyimide, benzocyclobutene (BCB), or the like, is formed on the passivation layer 58.

A pixel electrode 61, which operates as an anode of the OLED, is formed on the planarization layer 59, and a pixel defining layer 60, which is formed of an organic material, is formed to cover the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. The present invention is not limited to the structure of the organic light-emitting display device described above, as various structures of organic light-emitting display devices may be applied.

The OLED displays an image by emitting red, green, and blue light, according to current flow. The OLED includes: the pixel electrode 61, which is connected to the drain electrode 56 of the TFT; a counter electrode 63, which is formed so as to cover the entire sub-pixel; and the organic layer 62, which is disposed between the pixel electrode 61 and the counter electrode 63. A positive voltage is applied to the pixel electrode 61, and a negative voltage is applied to the counter electrode 63.

The pixel electrode 61 and the counter electrode 63 are insulated from each other by the organic layer 62, and apply their respective voltages to the organic layer 62, to induce light emission in the organic layer 62. The organic layer 62 may be a low-molecular weight organic layer or a high-molecular weight organic layer. When a low-molecular weight organic layer is used as the organic layer 62, the organic layer 62 may include one or more layers selected from the group consisting of a hole injection layer (HIL), a hole transport layer (HTL), an emission layer (EML), an electron transport layer (ETL), an electron injection layer (EIL), etc. Examples of available organic materials include copper phthalocyanine (CuPc), N,N'-di(naphthalene-1-yl)-N,N'-diphenyl-benzidine (NPB), tris-8-hydroxyquinoline aluminum (Alq3), etc. The low-molecular weight organic layer may be formed by vacuum deposition.

When a high-molecular weight organic layer is used as the organic layer 62, the organic layer 62 may have a structure including an HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like. The organic layer 62 is not limited to the organic layers described above, and may be embodied in various other ways.

The pixel electrode 61 operates as an anode, and the counter electrode 63 operates as a cathode. Alternatively, the pixel electrode 61 may operate as a cathode, and the counter electrode 63 may operate as an anode. The pixel electrode 61 may be a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer of ITO, IZO, ZnO, or $In_2O_3$ formed on the reflective layer.

The counter electrode 63 may be formed as a transparent electrode or a reflective electrode. When the counter electrode 63 is formed as a transparent electrode, the counter electrode 63 operates as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on a surface of the organic layer 62, and forming an auxiliary electrode layer or a bus electrode line thereon, using a transparent electrode forming material, such as ITO, IZO, ZnO, $In_2O_3$, or the like. When the counter electrode 63 is formed as a reflective electrode, the reflective layer may be formed by depositing Li, Ca, LiF/Ca, LiF/Al, Al, Ag, Mg, or a compound thereof, on the entire surface of the organic layer 62.

In the organic light-emitting display apparatus described above, the organic layer 62 including the emission layer may be formed using a thin film deposition assembly 100 (see FIG. 4), which will be described later. Hereinafter, a thin film deposition apparatus according to an exemplary embodiment of the present teachings and a method of manufacturing an organic light-emitting display device using the thin film deposition apparatus, will be described in detail.

Figure 3:
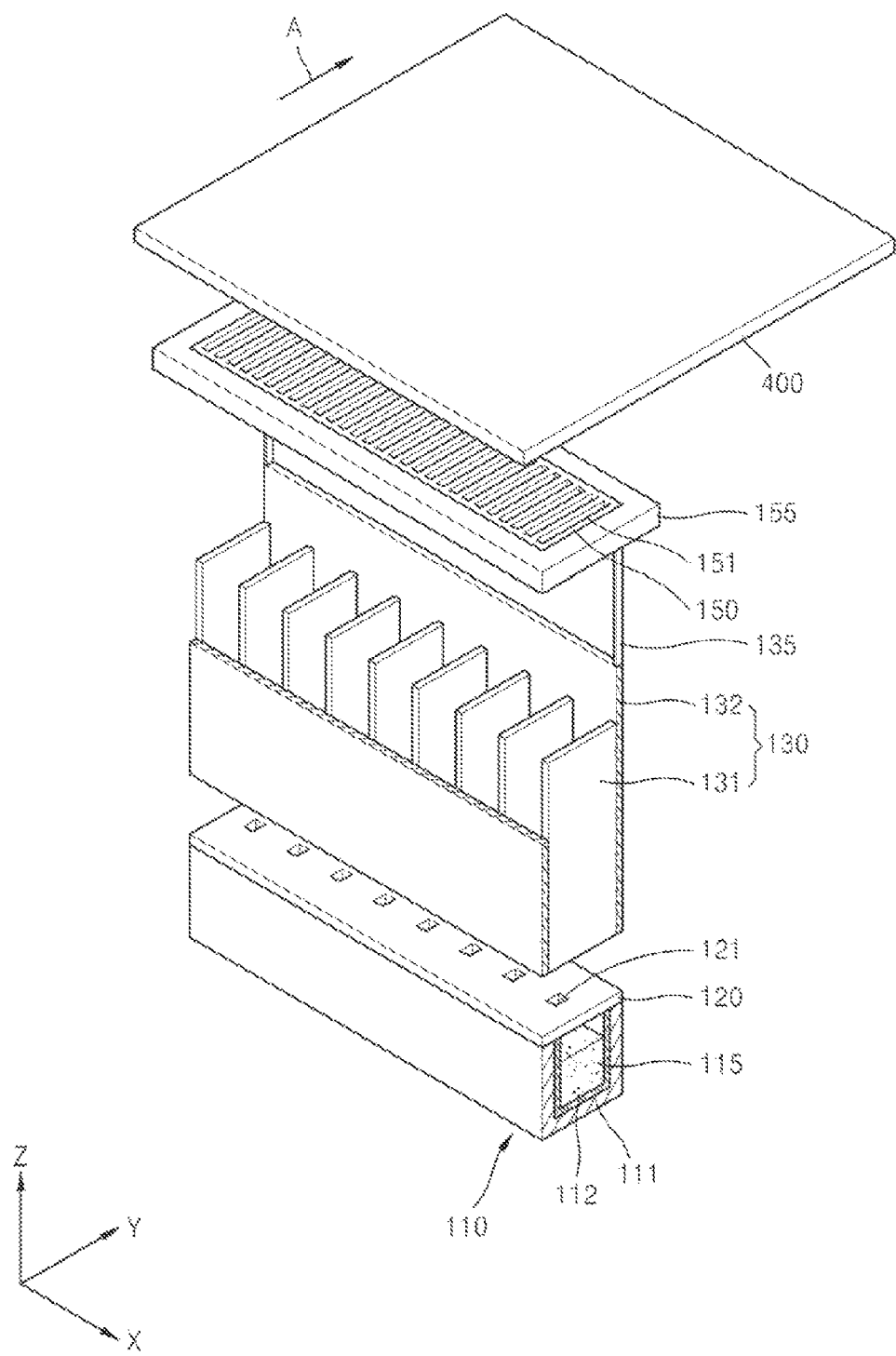
FIG. 3 is a schematic perspective view of a thin film deposition assembly, according to an exemplary embodiment of the present teachings.
Figure 4:
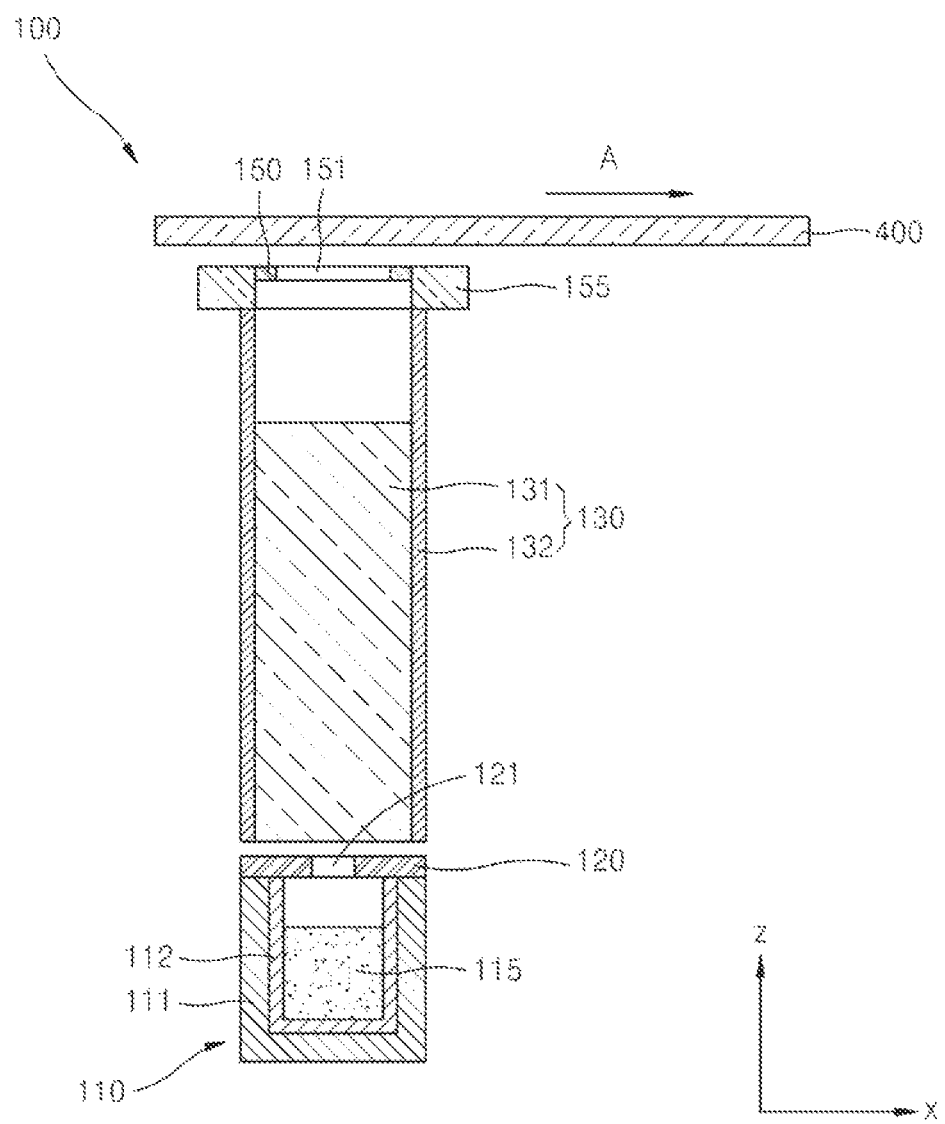
FIG. 4 is a schematic sectional view of the thin film deposition assembly illustrated in FIG. 3.
Figure 5:
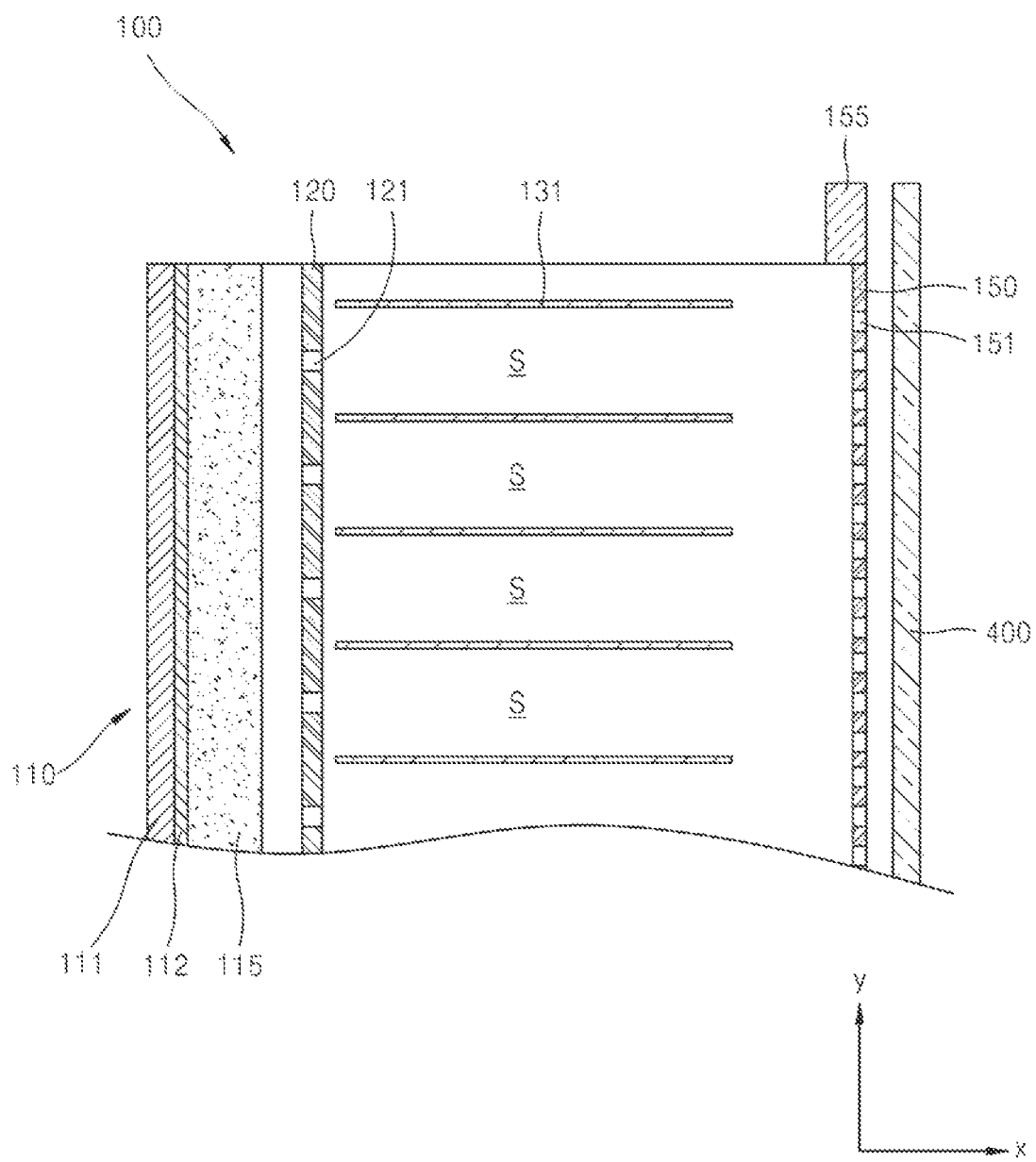
FIG. 5 is a schematic plan view of the thin film deposition assembly illustrated in FIG. 3.

FIG. 3 is a schematic perspective view of a thin film deposition assembly 100, according to an exemplary embodiment of the present teachings, FIG. 4 is a schematic side view of the thin film deposition assembly 100, and FIG. 5 is a schematic plan view of the thin film deposition assembly 100. Referring to FIGS. 3, 4, and 5, the thin film deposition assembly 100 includes a deposition source 110, a deposition source nozzle unit 120, a barrier plate assembly 130, and a patterning slit sheet 150.

Although not illustrated in FIGS. 3, 4, and 5 for convenience of explanation, all the components of the thin film deposition assembly 100 may be disposed within a chamber. The chamber is maintained at an appropriate vacuum, in order to facilitate the deposition of a deposition material.

In particular, a high-vacuum state is generally applied, which is similar to that applied when deposition method using a fine metal mask (FMM), in order to deposit a deposition material 115. The deposition material 115 is emitted from the deposition source 110 and is discharged through the deposition source nozzle unit 120 and the patterning slit sheet 150, onto a substrate 400, to form a desired pattern. In addition, the temperatures of barrier plates 131 and the patterning slit sheet 150 should be lower than the temperature of the deposition source 110. In this regard, the temperatures of the barrier plates 131 and the patterning slit sheet 150 may be about 100° C., or less. This is because the deposition material 115 that has collided against the barrier plates 131 may not be re-vaporized when the temperature of the barrier plates 131 is not sufficiently reduced. In addition, thermal expansion of the patterning slit sheet 150 may be minimized, when the temperature of the patterning slit sheet 150 is sufficiently reduced. The barrier plate assembly 130 faces the deposition source 110, which has a higher temperature. In addition, the temperature of a portion of the barrier plate assembly 130 close to the deposition source 110 may reach a maximum temperature of about 167° C. Thus, a partial-cooling apparatus may be further included, if needed. To this end, the barrier plate assembly 130 may include a cooling member (not shown).

The substrate 400, which constitutes a target on which the deposition material 115 is to be deposited, is disposed in the chamber. The substrate 400 may be any suitable substrate for a flat panel display. A large substrate, such as a mother glass for manufacturing a plurality of flat panel displays, may be used as the substrate 400.

The deposition may be performed while one of the substrate 400 and the thin film deposition assembly 100 is moved relative to the other. In particular, in the conventional FMM deposition method, the size of the FMM has to be equal to the size of a substrate. Thus, the size of the FMM has to be increased, as the substrate becomes larger. However, it is problematic to manufacture a large FMM or to extend an FMM, because of difficulties in accurately aligning a pattern.

In order to overcome this and/or other problems, in the thin film deposition assembly 100, deposition may be performed while one of the thin film deposition assembly 100 and the substrate 400 is moved relative to the other. In particular, deposition may be continuously performed while the substrate 400, which is disposed to face the thin film deposition assembly 100, is moved in a Y-axis direction. In other words, deposition is performed in a scanning manner, while the substrate 400 is moved in the direction of arrow A in FIG. 3, and the thin film deposition assembly 100 is fixed. Although the substrate 400 is illustrated as being moved in the Y-axis direction in FIG. 3, when deposition is performed, the present teachings are not limited thereto. In particular, deposition may be performed while the thin film deposition assembly 100 is moved in the Y-axis direction, and the substrate 400 is fixed.

Thus, in the thin film deposition assembly 100, the patterning slit sheet 150 may be significantly smaller than a FMM used in a conventional deposition method. In other words, in the thin film deposition assembly 100, deposition is continuously performed, i.e., in a scanning manner, while the substrate 400 is moved in the Y-axis direction. Thus, lengths of the patterning slit sheet 150 in the X-axis and Y-axis directions may be significantly smaller than the lengths of the substrate 400 in the X-axis and Y-axis directions.

As described above, since the patterning slit sheet 150 may be significantly smaller than a conventional FMM, it is relatively easier to manufacture the patterning slit sheet 150. In other words, using the patterning slit sheet 150, which is smaller than a FMM used in a conventional deposition method, is more convenient in all processes, including etching and subsequent other processes, such as precise extension, welding, moving, and cleaning processes, as compared to the conventional deposition method using the larger FMM. This is more advantageous for forming relatively large display devices.

In order to perform deposition while one of the thin film deposition assembly 100 and the substrate 400 is moved relative to the other, the thin film deposition assembly 100 and the substrate 400 may be separated from each other by a predetermined distance. This will be described below, in detail.

The deposition source 110 contains and heats the deposition material 115. The deposition source 110 and the substrate 400 are disposed on opposite sides of the chamber. The deposition material 115 is vaporized by the deposition source 110 and then deposited on the substrate 400.

In particular, the deposition source 110 includes a crucible 111 that is filled with the deposition material 115, and a heater 112 that heats the crucible 111 to vaporize the deposition material 115. The vaporized deposition material 115 exits the crucible 111 through the deposition source nozzle unit 120.

The deposition source nozzle unit 120 is disposed facing the substrate 400. The deposition source nozzle unit 120 includes a plurality of deposition source nozzles 121 that are arranged at equal intervals in the X-axis direction. The vaporized deposition material 115 passes through the deposition source nozzles 121 and then moves towards the substrate 400.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged in parallel planes, at equal intervals in the X-axis direction. In particular, each of the barrier plates 131 may be arranged parallel to a Y-Z plane in FIG. 3, i.e., perpendicular to the X-axis direction. The plurality of barrier plates 131 partition the space between the deposition source nozzle unit 120 and the patterning slit sheet 150 into a plurality of sub-deposition spaces S (see FIG. 5). The sub-deposition spaces S respectively correspond to the deposition source nozzles 121.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoints between adjacent barrier plates 131. Since the barrier plates 131 form the plurality of sub-deposition spaces S, the deposition material 115 discharged through each of the deposition source nozzles 121 is not mixed with adjacent the deposition materials 115, and passes through patterning slits 151 in the patterning slit sheet 150, so as to be deposited on the substrate 400. In other words, the barrier plates 131 prevent the deposition material 115 from flowing excessively in the X-axis direction.

As described above, the deposition material 115 is forced to move straight towards the patterning slit sheet 150, such that a smaller shadow zone may be formed on the substrate 400, as compared to a case where no barrier plates are installed. Thus, the thin film deposition assembly 100 and the substrate 400 can be separated from each other, as will be described in detail, below.

The barrier plate frame 132, which is disposed on opposing sides of the barrier plates 131, maintains the positions of the barrier plates 131, and guides the deposition material 115 discharged through the deposition source nozzles 121. The barrier plate frame 132 prevents the deposition material 115 from flowing excessively in the Y-axis direction.

Although the deposition source nozzle unit 120 and the barrier plate assembly 130 are illustrated as being separated from each other, the present teachings are not limited thereto. In order to prevent heat from being conducted to the barrier plate assembly 130 from the deposition source 110, the deposition source nozzle unit 120 and the barrier plate assembly 130 may be separated from each other. Alternatively, a heat insulator may be disposed between the deposition source nozzle unit 120 and the barrier plate assembly 130, such that these elements may be bound together, with the heat insulator therebetween.

The barrier plate assembly 130 may be detachable from the thin film deposition assembly 100. A conventional FMM deposition method has low deposition efficiency. Herein, deposition efficiency refers to the ratio of the amount of deposition material deposited on a substrate, to the amount of deposition material vaporized from a deposition source. The conventional FMM deposition method has a deposition efficiency of about 32%. Furthermore, in the conventional FMM deposition method, about 68% of organic deposition material, which has not been deposited on the substrate, remains adhered to a deposition apparatus, complicating the reuse of the deposition material.

In order to overcome these and/or other problems, in the thin film deposition assembly 100, the deposition space is enclosed by the barrier plate assembly 130, so that the deposition material 115 that is not deposited on the substrate 400 is mostly deposited within the barrier plate assembly 130. Thus, when a large amount of the deposition material 115 lies in the barrier plate assembly 130, the barrier plate assembly 130 may be detached from the thin film deposition assembly 100 and then placed in a separate deposition material recycling apparatus, in order to recover the deposition material 115. Due to the structure of the thin film deposition assembly 100, a reuse rate of the deposition material 115 is increased, thereby increasing the deposition efficiency and reducing manufacturing costs.

The patterning slit sheet 150 and a frame 155 in which the patterning slit sheet 150 is bound are disposed between the deposition source 110 and the substrate 400. The frame 155 may have a lattice shape, similar to a window frame. The patterning slit sheet 150 includes a plurality of patterning slits 151 arranged in the X-axis direction. The deposition material 115 passes through the deposition source nozzle unit 120 and the patterning slit sheet 150, and moves towards the substrate 400. The patterning slit sheet 150 may be manufactured by etching, which is the same method as used in a conventional method of manufacturing an FMM, and in particular, a striped FMM.

In the thin film deposition assembly 100, the total number of patterning slits 151 may be greater than the total number of deposition source nozzles 121. In addition, there may be a greater number of patterning slits 151 than deposition source nozzles 121, disposed between two adjacent barrier plates 131.

In other words, at least one of the deposition source nozzles 121 may be disposed between each pair of adjacent barrier plates 131. Meanwhile, a plurality of patterning slits 151 may be disposed between each adjacent pair of barrier plates 131. The space between the deposition source nozzle unit 120 and the patterning slit sheet 150 is partitioned by the barrier plates 131 into the sub-deposition spaces S that correspond to the deposition source nozzles 121, respectively. Thus, the deposition material 115 discharged from each of the deposition source nozzles 121 passes through the patterning slits 151 disposed in the sub-deposition space S corresponding to the deposition source nozzle 121, and is then deposited on the substrate 400.

In addition, the barrier plate assembly 130 and the patterning slit sheet 150 may be separated from each other. Alternatively, the barrier plate assembly 130 and the patterning slit sheet 150 may be connected by a connection member 135. The temperature of the barrier plate assembly 130 may increase to 100° C. or higher, due to being heated by the deposition source 110. In order to prevent the heat of the barrier plate assembly 130 from being conducted to the patterning slit sheet 150, the barrier plate assembly 130 and the patterning slit sheet 150 may be separated from each other by a predetermined distance.

As described above, the thin film deposition assembly 100 performs deposition, while being moved relative to the substrate 400. In order to move the thin film deposition assembly 100, the patterning slit sheet 150 is separated from the substrate 400. In addition, in order to prevent the formation of a relatively large shadow zone on the substrate 400, when the patterning slit sheet 150 and the substrate 400 are separated from each other, the barrier plates 131 are arranged between the deposition source nozzle unit 120 and the patterning slit sheet 150, to force the deposition material 115 to move in a straight direction. Thus, the size of the shadow zone formed on the substrate 400 is sharply reduced.

In a conventional deposition method using a FMM, deposition is performed with the FMM in close contact with a substrate, in order to prevent the formation of a shadow zone on the substrate. However, the close contact may cause defects. In addition, in the conventional deposition method, the size of the mask has to be the same as the size of the substrate, since the mask cannot be moved relative to the substrate. Thus, a large mask is conventionally used to form a large display device. However, it is not easy to manufacture such a large mask.

In order to overcome this and/or other problems, in the thin film deposition assembly 100, the patterning slit sheet 150 is separated from the substrate 400. This may be facilitated by installing the barrier plates 131, to reduce the size of the shadow zone formed on the substrate 400.

As described above, according to the present teachings, a mask is smaller than a substrate, and deposition is performed while the mask is moved relative to the substrate. Thus, the mask can be easily manufactured. In addition, defects caused by contact between a substrate and a FMM, which occur in the conventional deposition method, may be prevented. Furthermore, since it is unnecessary to use the FMM in close contact with the substrate, manufacturing speeds may be improved.

Figure 6A:
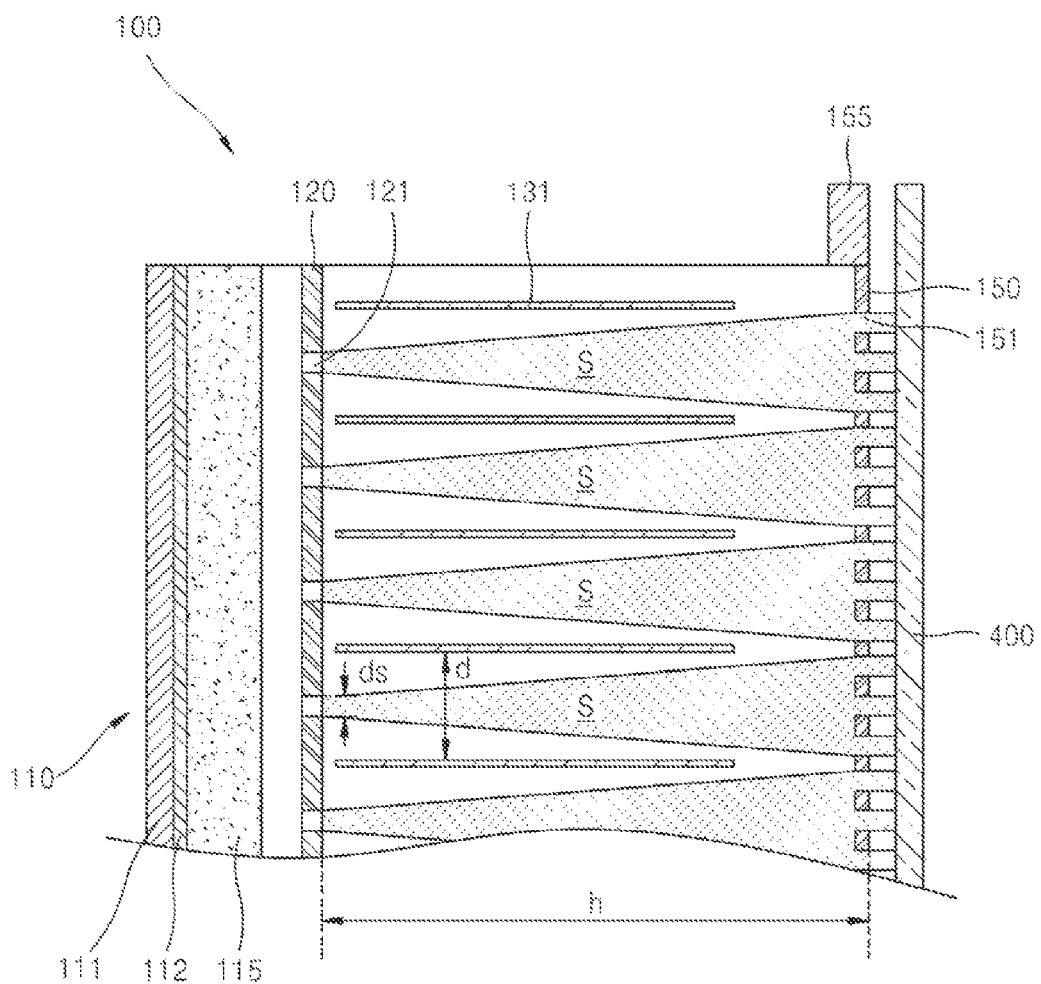
FIG. 6A is a schematic view for describing deposition of a deposition material in the thin film deposition assembly of FIG. 3, according to an exemplary embodiment of the present teachings.
Figure 6B:
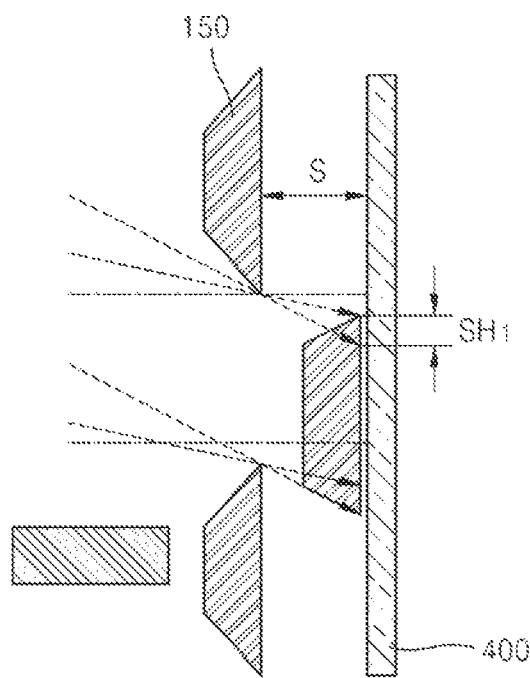
FIG. 6B illustrates a shadow zone of a thin film deposited on a substrate, when a deposition space is partitioned by barrier plates as illustrated in FIG. 6A, according to an exemplary embodiment of the present teachings.
Figure 6C:
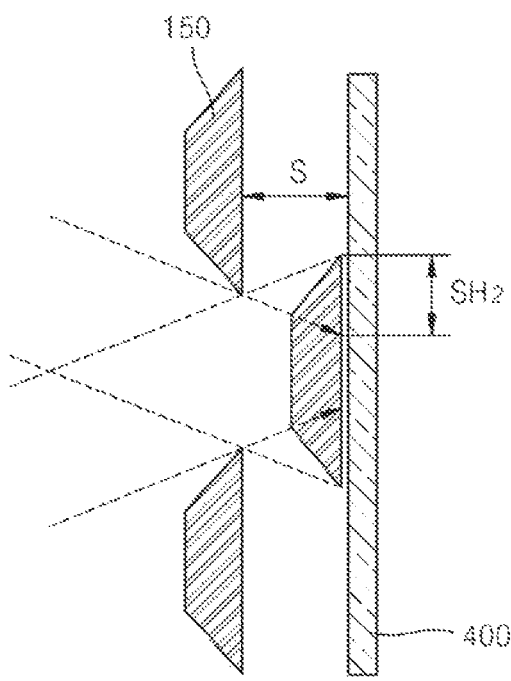
FIG. 6C illustrates a shadow zone of a thin film deposited on the substrate when the deposition space is not partitioned.

FIG. 6A is a schematic view showing the deposition of the deposition material 115 in the thin film deposition assembly 100, according to an exemplary embodiment of the present teachings. FIG. 6B illustrates a shadow zone of a thin film deposited on the substrate 400, when the deposition space is partitioned by the barrier plates 131. FIG. 6C illustrates a shadow zone of a thin film deposited on the substrate 400, when the deposition space is not partitioned.

Referring to FIG. 6A, the deposition material 115 that is vaporized in the deposition source 110 is by being discharged through the deposition source nozzle unit 120 and the patterning slit sheet 150, and deposited on the substrate 400. Since the space between the deposition source nozzle unit 120 and the patterning slit sheet 150 is partitioned into the plurality of sub-deposition spaces S by the barrier plates 131, the deposition material 115 of adjacent deposition source nozzles 121 is not mixed.

When the space between the deposition source nozzle unit 120 and the patterning slit sheet 150 is partitioned by the barrier plate assembly 130, as illustrated in FIGS. 6A and 6B, a width $SH_1$ of a shadow zone formed on the substrate 400 may be determined using Equation 1 below.

$$SH_1 = s * d_s/h \qquad \text{Equation 1}$$

In Equation 1, s denotes a distance between the patterning slit sheet 150 and the substrate 400, $d_s$ denotes a width of each of the deposition source nozzles 121, and h denotes a distance between the deposition source 110 and the patterning slit sheet 150.

When the space between the deposition source nozzle unit 120 and the patterning slit sheet 150 is not partitioned by the barrier plates 131, as illustrated in FIG. 6C, the deposition material 115 is discharged through the patterning slit sheet 150 in a wider range of angles than in the case of FIG. 6B. This is because the deposition materials 115 discharged from different deposition source nozzles 121 can pass through the same patterning slit 151. Thus, a width $SH_2$ of a shadow zone formed on the substrate 400 is much greater than when the deposition space is partitioned by the barrier plates 131. The width $SH_2$ of the shadow zone formed on the substrate 400 is determined using Equation 2.

$$SH_2 = s * 2d/h \qquad \text{Equation 2}$$

In Equation 2, s denotes a distance between the patterning slit sheet 150 and the substrate 400, d denotes an interval between adjacent barrier plates 131, and h denotes a distance between the deposition source 110 and the patterning slit sheet 150.

Referring to Equations 1 and 2, $d_s$, which is the width of each of the deposition source nozzles 121, is up to tens of times smaller than d, which is the interval between the adjacent barrier plates 131. Thus the shadow zone may have a smaller width when the space between the deposition source nozzle unit 120 and the patterning slit sheet 150 is partitioned by the barrier plates 131. The width $SH_2$ of the shadow zone formed on the substrate 400 may be reduced by: (1) reducing the interval d between the adjacent barrier plates 131, (2) reducing the distance s between the patterning slit sheet 150 and the substrate 400, and/or (3) by increasing the distance h between the deposition source 110 and the patterning slit sheet 150.

As described above, the shadow zone formed on the substrate 400 may be reduced by installing the barrier plates 131. Thus, the patterning slit sheet 150 can be separated from the substrate 400.

Figure 7:
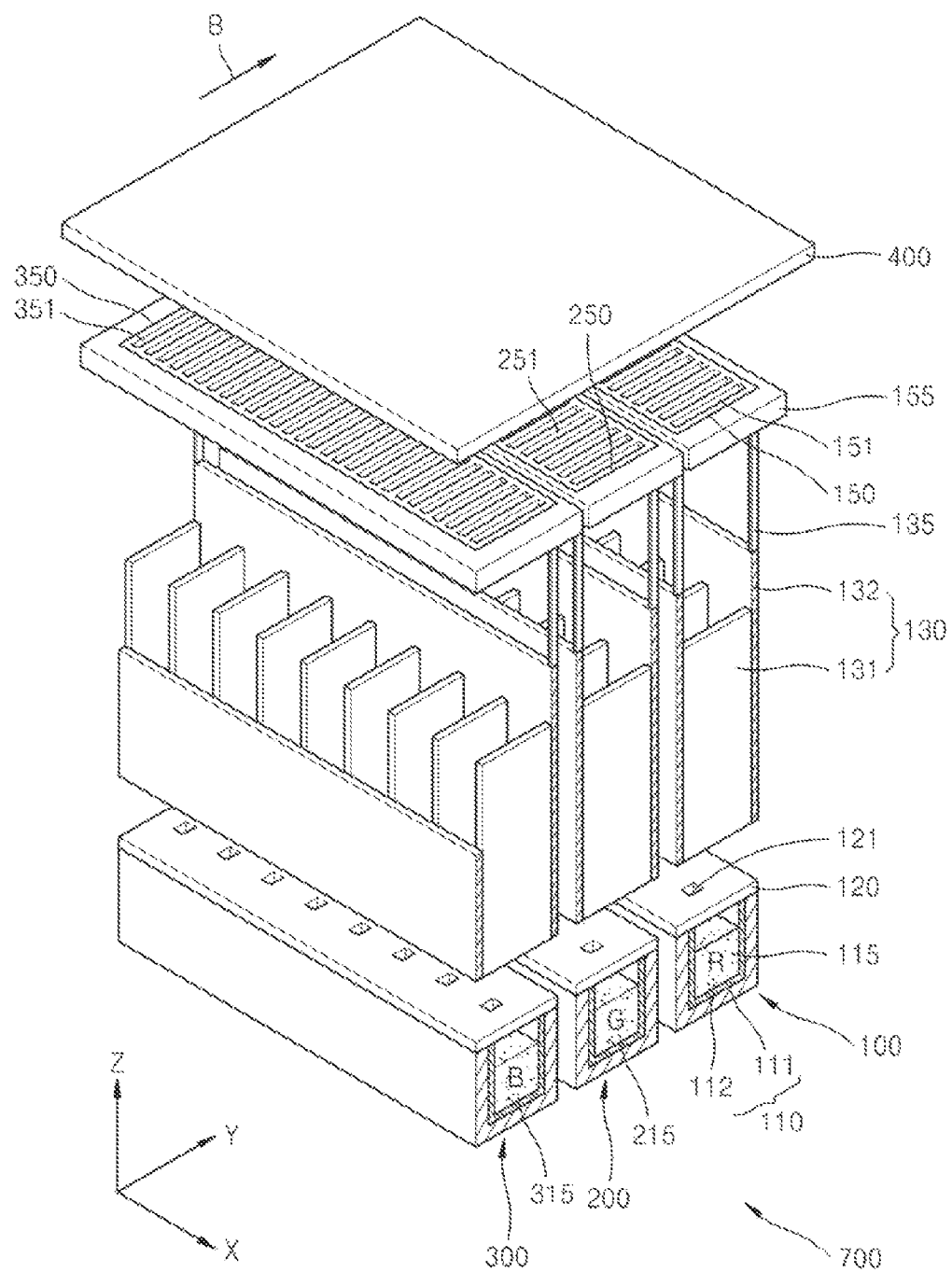
FIG. 7 is a schematic perspective view of a thin film deposition apparatus, according to an exemplary embodiment of the present teachings.

FIG. 7 is a schematic perspective view of a thin film deposition apparatus 700, according to an exemplary embodiment of the present teachings. Referring to FIG. 7, the thin film deposition apparatus 700 includes a plurality of thin film deposition assemblies, each of which has the structure of the thin film deposition assembly 100 illustrated in FIGS. 3 through 5. In other words, the thin film deposition apparatus 700 includes a multi-deposition source that simultaneously discharges deposition materials for forming an red (R) emission layer, a green (G) emission layer, and a blue (B) emission layer.

In particular, the thin film deposition apparatus 700 includes a first thin film deposition assembly 100, a second thin film deposition assembly 200, and a third thin film deposition assembly 300. Each of the thin film deposition assemblies 100, 200, and 300 has the same structure as the thin film deposition assembly 100. Thus a detailed description thereof will not be repeated.

The thin film deposition assemblies 100, 200, and 300 may contain different deposition materials, respectively. The first thin film deposition assembly 100 may contain a deposition material for forming a R emission layer, the second thin film deposition assembly 200 may contain a deposition material for forming a G emission layer, and the third thin film deposition assembly 300 may contain a deposition material for forming a B emission layer.

In a conventional method of manufacturing an organic light-emitting display device, a separate chamber and mask are used to form each color emission layer. However, the thin film deposition apparatus 700 can simultaneously form R, G, and B emission layers. Thus, the time it takes to manufacture an organic light-emitting display device is sharply reduced. In addition, an organic light-emitting display device may be manufactured using fewer chambers, so that equipment costs are also markedly reduced.

Although not illustrated, a patterning slit sheet 150 of the first thin film deposition assembly 100, a patterning slit sheet 250 of the second thin film deposition assembly 200, a patterning slit sheet 350 of the third thin film deposition assembly 300 may be offset from one another, by a constant distance, in order for deposition regions corresponding to the patterning slit sheets 150, 250, and 350 not to overlap on the substrate 400. In other words, when the thin film deposition assemblies 100, 200, and 300 are used to form R, G, and B emission layers patterning slits 151, 251, and 351 of the thin film deposition assemblies 100, 200, and 300, respectively, are not aligned with each other, in order to form the R, G, and B emission layers in different regions of the substrate 400.

In addition, the deposition materials may have different deposition temperatures. Therefore, the temperatures of the deposition sources of the respective first, second, and third thin film deposition assemblies 100, 200, and 300 may be different.

Although the thin film deposition apparatus 700 includes three thin film deposition assemblies, the present teachings are not limited thereto. In other words, a thin film deposition apparatus, according to another exemplary embodiment, may include a plurality of thin film deposition assemblies, each containing a different deposition material. For example, a thin film deposition apparatus may include five thin film deposition assemblies respectively containing materials for an R emission layer, a G emission layer, a B emission layer, an auxiliary layer (R') of the R emission layer, and an auxiliary layer (G') of the G emission layer.

As described above, a plurality of thin films may be formed at the same time, using a plurality of thin film deposition assemblies. Thus, manufacturing yields and deposition efficiencies are improved. In addition, the overall manufacturing process is simplified, and the manufacturing costs are reduced.

Organic layers (refer to the organic layer 62 in FIG. 2) may be formed with a thin film deposition apparatus having the structure described above. A method of manufacturing an organic light-emitting display device, according to an exemplary embodiment of the present teachings, may include: separating the substrate 400 from the thin film deposition apparatus; and depositing a deposition material while moving one of the thin film deposition apparatus 700 and the substrate 400 relative to the other.

In detail, the substrate 400 is spaced apart from the thin film deposition apparatus by a predetermined distance. As described above, the thin film deposition apparatus may include the patterning slit sheets 150, 250, and 350, each of which is smaller than the substrate 400. Thus, deposition may be performed while one of the thin film deposition apparatus and the substrate 400 is moved relative to the other. In other words, deposition may be continuously performed while the substrate 400 is moved in the Y-axis direction. In other words, deposition is performed in a scanning manner, while the substrate 400 is moved in the direction of an arrow B, in FIG. 7. In addition, the thin film deposition apparatus and the substrate 400 are separated from each other, in order to move one of the thin film deposition apparatus and the substrate 400 relative to the other. For this reason, the substrate 400 is disposed in a chamber (not shown) separated from the thin film deposition apparatus.

Next, a deposition material discharged from the thin film deposition apparatus is deposited on the substrate 400, while the thin film deposition apparatus or the substrate 400 is moved. Although FIG. 7 illustrates that the substrate 400 is moved in the Y-axis direction, while the thin film deposition apparatus is fixed, the present teachings are not limited thereto. For example, the substrate 400 may be fixed and the thin film deposition apparatus may be moved relative to the substrate 400.

The thin film deposition apparatus may include a multi-deposition source. Thus, a plurality of organic layers may be simultaneously formed. In other words, the thin film deposition apparatus may include a plurality of thin film deposition assemblies, so that R, G, and B emission layers may be formed at the same time, using a single multi-deposition source. Thus, the time taken to manufacture the organic light-emitting display device is sharply reduced, and equipment costs are also markedly reduced, since fewer chambers are used.

Figure 8:
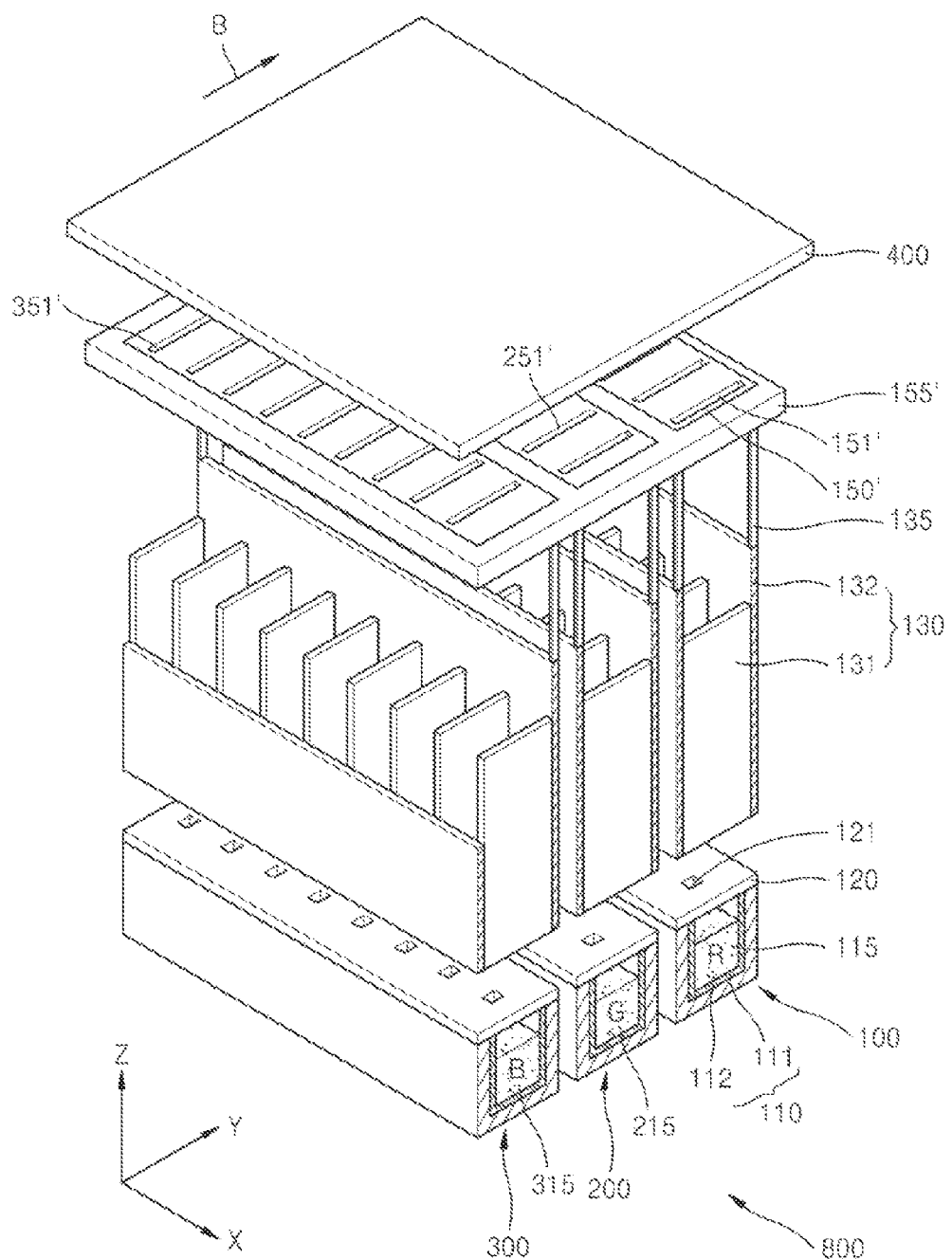
FIG. 8 is a schematic perspective view of a thin film deposition apparatus, according to another exemplary embodiment of the present teachings.

FIG. 8 is a schematic perspective view of a thin film deposition apparatus 800, according to another exemplary embodiment of the present teachings. The thin film deposition apparatus 800 is similar to the deposition apparatus 700, so only the differences therebetween are described in detail.

Referring to FIG. 8, the thin film deposition apparatus 800 includes an integrated patterning slit sheet 150'. In particular, the first thin film deposition assembly 100, the second thin film deposition assembly 200, and the third thin film deposition assembly 300 share the single patterning slit sheet 150. In addition, the patterning slit sheet 150' includes patterning slits 151' formed in a region corresponding to the first thin film deposition assembly 100, patterning slits 251' formed in a region corresponding to the second thin film deposition assembly 200, and patterning slits 351' formed in a region corresponding to the third thin film deposition assembly 300.

The patterning slits 151', 251', and 351' are offset by a constant distance with respect to each other, in order for deposition regions corresponding to the patterning slits 151', 251' and 351' not to overlap on the substrate 400. In other words, when the thin film deposition assemblies 100, 200, and 300 are used to form R, G, and B emission layers in different regions on the substrate 400, since the patterning slits 151', 251', and 351' are not aligned with each other, with respect to the Y axis direction. Due to the above-described structure, the thin film deposition assemblies 100, 200, and 300 and the patterning slit sheet 150' may be accurately and appropriately arranged, through a single alignment process.

Figure 9:
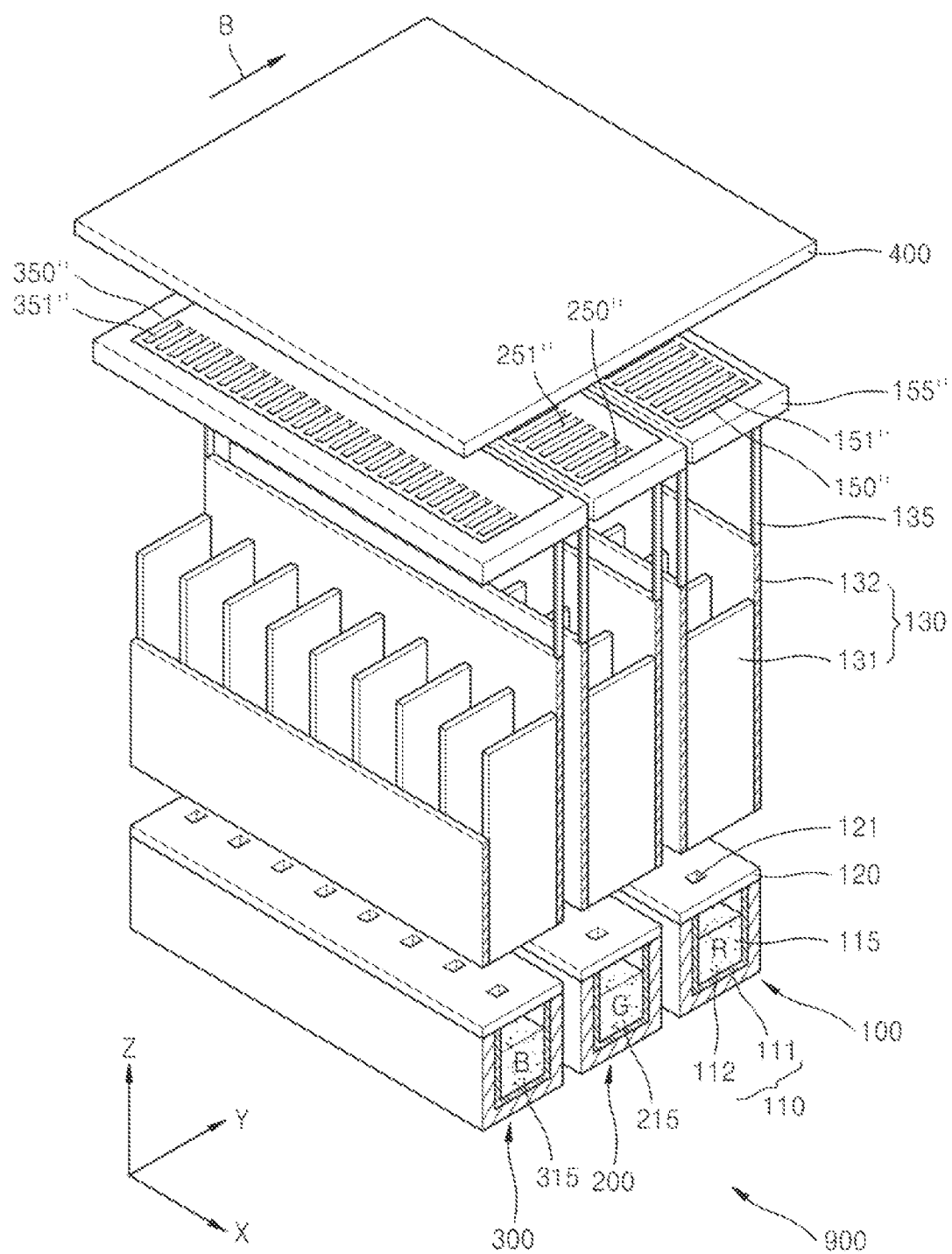
FIG. 9 is a schematic perspective view of a thin film deposition apparatus, according to another exemplary embodiment of the present teachings.

FIG. 9 is a schematic perspective view of a thin film deposition apparatus 900, according to another exemplary embodiment of the present teachings. The thin film deposition apparatus 900 is similar to the deposition apparatus 700, so only the differences therebetween are described in detail. Referring to FIG. 9, the thin film deposition apparatus 900 includes patterning slit sheets 150", 250", and 350" respectively having pattering slits 151", 251", and 351" of different lengths.

Accordingly, the thin film deposition apparatus 900 can be used to produce an organic light-emitting display device having organic layers with different thicknesses. For example, the organic layer in an R sub-pixel may have a thickness of about 1600 Å to about 2200 Å. The organic layer in a G sub-pixel may have a thickness of about 1000 Å to about 1200 Å. The organic layer in a B sub-pixel may have a thickness of about 100 Å to about 500 Å. If the thicknesses of the organic layers are outside the ranges defined above, the organic layers may not have sufficient hole injecting and hole transporting capabilities to induce a resonance effect in the emission layers. Thus, color purity is deteriorated, and emission efficiency is reduced. In addition, if the thicknesses of the organic layers are greater than the upper limits defined above, the driving voltage may be increased.

Thus, in an organic light-emitting display device manufactured with the thin film deposition apparatus 900, the emission layers may have different thicknesses. To this end, the temperatures of the thin film deposition assemblies 100, 200, and 300 may be separately controlled. However, the extent to which the temperatures can be controlled may be limited. Thus, in the thin film deposition apparatus 900, the patterning slits 151", 251", and 351" have different lengths. Therefore, the emission layers produced by the thin film deposition apparatus 900 may have different thicknesses.

As described above, the organic layers in the R, G, and B sub-pixels may have different thicknesses. Thus, the amount of deposition should be the largest in the first thin film deposition assembly 100, which forms the R emission layer, and should be the smallest in the third thin film deposition assembly 300, which forms the B emission layer. In order to vary the amounts of deposition in the separate thin film deposition assemblies, the length of the patterning slits 151" of the first thin film deposition assembly 100, which forms the R emission layers, may be the greatest; the length of patterning slits 251" of the second thin film deposition assembly 200, which forms the G emission layers, may be less than that of the patterning slits 151"; and the length of patterning slits 351" of the third thin film deposition assembly 300, which forms the G emission layer, may be less than the length of the patterning slits 251".

By varying the lengths of the patterning slits as described above, the amounts of deposition materials that pass through the patterning slit sheets toward the substrate 400 may be controlled. Thus, the emission layers may be formed to have different thicknesses.

Figure 10:
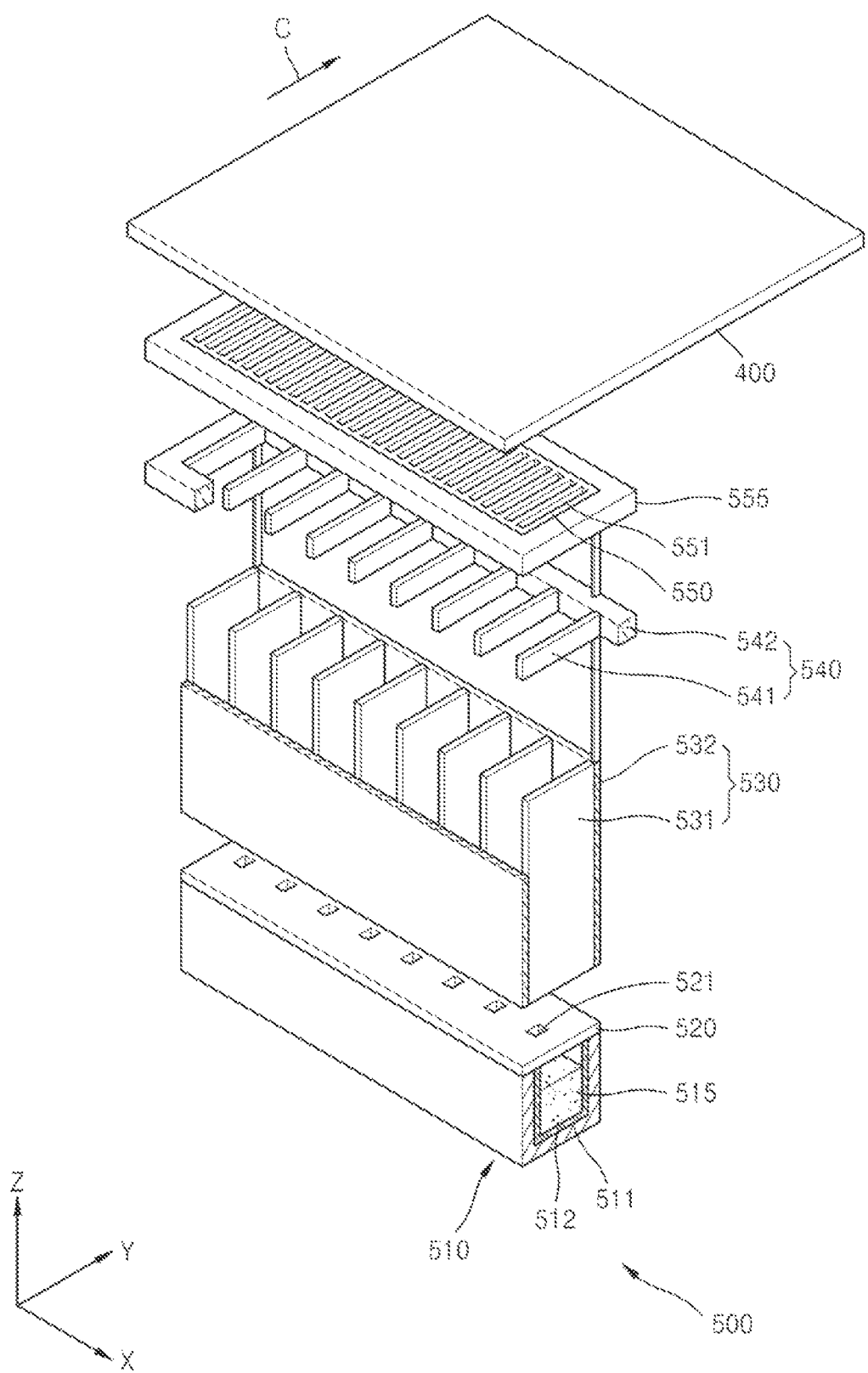
FIGS. 10 and 11 are schematic perspective views of thin film deposition apparatuses, according to further exemplary embodiments of the present teachings.

FIG. 10 is a schematic perspective view of a thin film deposition assembly 500 according to another exemplary embodiment of the present teachings. Referring to FIG. 10, the thin film deposition assembly 500 a deposition source 510, a deposition source nozzle unit 520, a first barrier plate assembly 530, a second barrier plate assembly 540, a patterning slit sheet 550, and a substrate 400. Although not illustrated in FIG. 10 for convenience of explanation, all the components of the thin film deposition assembly 500 may be disposed within a chamber that is maintained at an appropriate degree of vacuum, to allow a deposition material to move in a straight direction.

The substrate 400, which constitutes a target on which a deposition material 515 is to be deposited, is disposed in the chamber. The deposition source 510 contains and heats the deposition material 515 and is disposed on an opposite side of the chamber to the substrate 400. The deposition source 510 may include a crucible 511 and a heater 512.

The deposition source nozzle unit 520 is disposed at a side of the deposition source 510, facing the substrate 400. The deposition source nozzle unit 520 includes a plurality of deposition source nozzles 521 arranged (spaced apart) in the X-axis direction.

The first barrier plate assembly 530 is disposed at a side of the deposition source nozzle unit 520. The first barrier plate assembly 530 includes a plurality of first barrier plates 531, and a first barrier plate frame 532 that covers sides of the first barrier plates 531.

The second barrier plate assembly 540 is disposed at a side of the first barrier plate assembly 530. The second barrier plate assembly 540 includes a plurality of second barrier plates 541, and a second barrier plate frame 542 that covers sides of the second barrier plates 541.

The patterning slit sheet 550 and a frame 555 housing the patterning slit sheet 550 are disposed between the deposition source 510 and the substrate 400. The frame 555 may be formed in a lattice shape, similar to a window frame. The patterning slit sheet 550 includes a plurality of patterning slits 551 arranged in the X-axis direction.

The thin film deposition assembly 500 includes two separate barrier plate assemblies, i.e., the first barrier plate assembly 530 and the second barrier plate assembly 540, unlike the thin film deposition assembly 100 illustrated in FIG. 3, which includes only the barrier plate assembly 130. The plurality of first barrier plates 531 may be arranged parallel to each other, at equal intervals in the X-axis direction. In addition, each of the first barrier plates 531 may be formed to extend along a YZ plane in FIG. 10, i.e., perpendicular to the X-axis direction.

The plurality of second barrier plates 541 may be arranged parallel to each other, spaced apart at equal intervals in the X-axis direction. In addition, each of the second barrier plates 541 may be formed to extend in the YZ plane in FIG. 10, i.e., perpendicular to the X-axis direction.

The plurality of first barrier plates 531 and second barrier plates 541 partition the space between the deposition source nozzle unit 520 and the patterning slit sheet 550. In the thin film deposition assembly 500, the sub-deposition spaces that respectively correspond to the deposition source nozzles 521, through which the deposition material 515 is discharged.

The second barrier plates 541 may be disposed to correspond respectively to the first barrier plates 531. In other words, the second barrier plates 541 may be parallel to the first barrier plates 531. Each pair of the corresponding first and second barrier plates 531 and 541 may be located on the same plane. As described above, since the space between the deposition source nozzle unit 520 and the patterning slit sheet 550 is partitioned by the first barrier plates 531 and the second barrier plates 541, the deposition materials 515 discharged through adjacent deposition source nozzles 521 are not mixed, prior to being deposited on the substrate 400 through the patterning slits 551. In other words, the first barrier plates 531 and the second barrier plates 541 prevent the deposition material 515 from moving in the X-axis direction.

Figure 11:
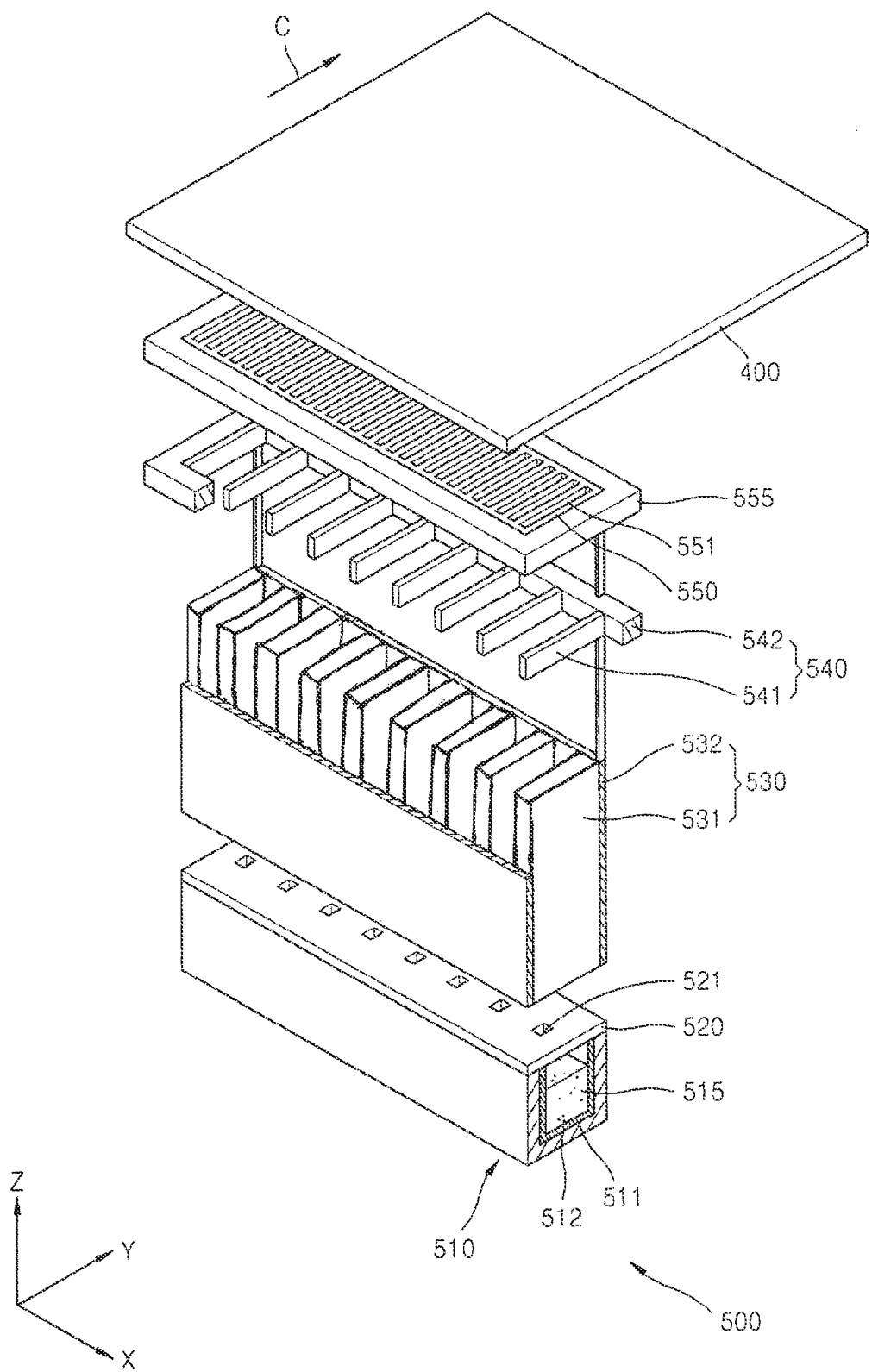

Although the first barrier plates 531 and the second barrier plates 541 are respectively illustrated in FIG. 10 as having the same thickness in the X-axis direction, the present teachings are not limited thereto. In other words, the second barrier plates 541, which should be accurately aligned with the patterning slit sheet 550, may be relatively thinner, whereas the first barrier plates 531, which do not need to be precisely aligned with the patterning slit sheet 550, may be relatively thicker, as respectively illustrated in FIG. 11. This makes it easier to manufacture the thin film deposition assembly.

Although not illustrated, a thin film deposition apparatus according to another exemplary embodiment of the present invention may include a plurality of the thin film deposition assemblies 500. In other words, the thin film deposition apparatus may include a multi-deposition source that simultaneously discharges deposition materials for forming R, G, and B emission layers. Deposition is performed in a scanning manner, while the substrate 400 is moved in a direction of an arrow C, in FIG. 10. Since the plurality of thin film deposition assemblies have been described in detail in the previous embodiment, a detailed description thereof will not be provided here.

According to aspects of the present teachings a thin film deposition apparatus and a method of manufacturing an organic light-emitting display device using the same, may be simply applied to produce a large number of large substrates. In addition, the thin film deposition apparatus and the organic-light-emitting display device may be easily manufactured, may improve manufacturing yield and deposition efficiency, and may allow deposition materials to be reused.

Although a few exemplary embodiments of the present teachings have been shown and described, it would be appreciated by those skilled in the art that changes may be made in these exemplary embodiments, without departing from the principles and spirit of the invention, the scope of which is defined in the claims and their equivalents.

What is claimed is:

1. A thin film deposition apparatus to form a thin film on a substrate, the apparatus comprising thin film deposition assemblies, each of which comprises:

a deposition source configured to discharge a deposition material;

a deposition source nozzle unit that is disposed on the deposition source, the deposition source nozzle unit comprising deposition source nozzles that are spaced apart in a first direction;

a patterning slit sheet that is disposed facing the deposition source nozzle unit, the patterning slit sheet having patterning slits that are spaced apart in the first direction to form a row of the patterning slits; and a barrier plate assembly that is disposed between the deposition source nozzle unit and the patterning slit sheet, the barrier plate assembly being separated from the deposition source nozzle unit, being configured to have lower temperature than the deposition source while the thin film is being formed, and comprising barrier plates that are spaced apart in the first direction and partition a space between the deposition source nozzle unit and the patterning slit sheet into sub-deposition spaces, the barrier plates being spaced between respective pairs of adjacent deposition source nozzles of the deposition source nozzles such that the sub-deposition spaces correspond to respective ones of the deposition source nozzles, the thin film deposition assembly configured to pass the deposition material through each of the sub-deposition spaces, wherein the thin film deposition apparatus and the substrate are spaced apart, and one of the thin film deposition apparatus and the substrate is movable relative to the other, wherein the thin film deposition assemblies are spaced apart in a second direction perpendicular to the first direction such that the rows of the patterning slits of the thin film deposition assemblies are spaced apart from one another in the second direction, and wherein the thin film deposition apparatus is configured to concurrently pattern the deposition materials from the respective deposition sources on the substrate through the patterning slits of the respective rows of the patterning slits, the respective patterning slit sheets being smaller than the substrate in at least one of the first direction or the second direction.

2. The thin film deposition apparatus of claim 1, wherein the deposition sources respectively contain different deposition materials.

3. The thin film deposition apparatus of claim 1, wherein the deposition materials are concurrently discharged from the deposition sources and deposited on the substrate.

4. The thin film deposition apparatus of claim 1, wherein the apparatus comprises three of the thin film deposition assemblies, and the deposition materials contained in the three deposition sources respectively form red, green, and blue emission layers.

5. The thin film deposition apparatus of claim 1, wherein the thin film deposition assemblies are configured to continuously deposit their respective deposition materials on the substrate, while one of the substrate or the thin film deposition apparatus is moved relative to the other.

6. The thin film deposition apparatus of claim 1, wherein the thin film deposition apparatus or the substrate is movable along a plane parallel to a surface of the substrate.

7. The thin film deposition apparatus of claim 1, wherein the patterning slit sheets are smaller than the substrate.

8. The thin film deposition apparatus of claim 1, wherein the barrier plate assemblies guide the discharged deposition materials to the patterning slit sheets.

9. The thin film deposition apparatus of claim 1, wherein the temperatures of the deposition sources are separately controllable.

10. The thin film deposition apparatus of claim 1, wherein, the patterning slits of each of the thin film deposition assemblies are offset with respect to one another, in the first direction.

11. The thin film deposition apparatus of claim 1, wherein the patterning slit sheets are integrally formed as a single patterning slit sheet.

12. The thin film deposition apparatus of claim 11, wherein the single patterning slit sheet has the patterning slits disposed in the rows, the patterning slits in each of the rows being offset from one another, in the first direction.

13. The thin film deposition apparatus of claim 1, wherein the patterning slits of each of the thin film deposition assemblies have a different length.

14. The thin film deposition apparatus of claim 13, wherein the amounts of the deposition materials deposited on the substrate are controlled according to the lengths of the patterning slits.

15. The thin film deposition apparatus of claim 1, wherein surfaces of the barrier plates extend in parallel with one another in a third direction extending between the deposition source nozzle units and the patterning slit sheets, the third direction substantially perpendicular to the first direction.

16. The thin film deposition apparatus of claim 1, wherein the barrier plates are spaced apart by equal distances.

17. A thin film deposition apparatus to form a thin film on a substrate, the apparatus comprising thin film deposition assemblies, each of which comprises:
a deposition source configured to discharge a deposition material;
a deposition source nozzle unit that is disposed on the deposition source, the deposition source nozzle unit comprising deposition source nozzles that are spaced apart in a first direction;
a patterning slit sheet that is disposed facing the deposition source nozzle unit, the patterning slit sheet having patterning slits that are spaced apart in the first direction to form a row of the patterning slits; and
a barrier plate assembly that is disposed between the deposition source nozzle unit and the patterning slit sheet, the barrier plate assembly comprising first barrier plates that are spaced apart in the first direction and partition a space between the deposition source nozzle unit and the patterning slit sheet into sub-deposition spaces, the first barrier plates being spaced between respective pairs of adjacent deposition source nozzles of the deposition source nozzles such that the sub-deposition spaces correspond to respective ones of the deposition source nozzles, the thin film deposition assembly configured to pass the deposition material through each of the sub-deposition spaces,
wherein the thin film deposition apparatus and the substrate are spaced apart, and one of the thin film deposition apparatus and the substrate is movable relative to the other while the thin film is being formed,
wherein each of the thin film deposition assemblies further comprises another barrier plate assembly disposed between the barrier plate assembly and the patterning slit sheet, the another barrier plate assembly comprising second barrier plates that are shorter than the first barrier plates in a second direction that is substantially perpendicular to the first direction,
wherein the thin film deposition assemblies are spaced apart in a third direction perpendicular to the first direction such that the rows of the patterning slits of the thin film deposition assemblies are spaced apart from one another in the third direction, and
wherein the thin film deposition apparatus is configured to concurrently pattern the position materials from the respective deposition sources on the substrate through the patterning slits of the respective rows of the patterning slits, the respective patterning slit sheets being smaller than the substrate in at least one of the first direction or the third direction.

18. The thin film deposition apparatus of claim 17, wherein the first and second barrier plates extend in parallel planes that extend in the second direction.

19. The thin film deposition apparatus of claim 17, wherein pairs of the first and second barrier plates are coplanar.

20. A thin film deposition apparatus to form a thin film on a substrate, the apparatus comprising thin film deposition assemblies, each of which comprises:
a deposition source configured to discharge a deposition material;
a deposition source nozzle unit that is disposed on the deposition source, the deposition source nozzle unit comprising deposition source nozzles that are spaced apart in a first direction;
a patterning slit sheet that is disposed facing the deposition source nozzle unit, the patterning slit sheet having patterning slits that are spaced apart in the first direction; and
a barrier plate assembly that is disposed between the deposition source nozzle unit and the patterning slit sheet, the barrier plate assembly comprising first barrier plates that partition a space between the deposition source nozzle unit and the patterning slit sheet into sub-deposition spaces, wherein the thin film deposition apparatus and the substrate are spaced apart, and one of the thin film deposition apparatus and the substrate is movable relative to the other while the thin film is being formed, and wherein each of the thin film deposition assemblies further comprises another barrier plate assembly disposed between the barrier plate assembly and the patterning slit sheet, the another barrier plate assembly comprising second barrier plates that are shorter than the first barrier plates in a second direction that is substantially perpendicular to the first direction, wherein the first barrier plates are thicker than the second barrier plates, in the first direction.

* * * * *